(12) United States Patent
Hori et al.

(10) Patent No.: US 7,269,773 B2
(45) Date of Patent: Sep. 11, 2007

(54) TEST PROGRAM DEBUGGER DEVICE, SEMICONDUCTOR TEST APPARATUS, TEST PROGRAM DEBUGGING METHOD AND TEST METHOD

(75) Inventors: Mitsuo Hori, Tokyo (JP); Hideki Tada, Tokyo (JP); Takahiro Kataoka, Tokyo (JP); Hiroyuki Sekiguchi, Tokyo (JP); Kazuo Mukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 210 days.

(21) Appl. No.: 11/211,162

(22) Filed: Aug. 24, 2005

(65) Prior Publication Data

US 2006/0248390 A1  Nov. 2, 2006

Related U.S. Application Data

(63) Continuation of application No. PCT/JP2004/014659, filed on Oct. 5, 2004.

(30) Foreign Application Priority Data

Oct. 7, 2003   (JP) .............................. 2003-348617

(51) Int. Cl.
   *G06F 11/00* (2006.01)
(52) U.S. Cl. ...................................... 714/741; 714/739

(58) Field of Classification Search ............... 324/73.1; 714/724, 741, 739; 702/123; 717/124
See application file for complete search history.

(56) References Cited

U.S. PATENT DOCUMENTS

| | | | | |
|---|---|---|---|---|
| 5,206,582 A * | 4/1993 | Ekstedt et al. | ............. | 324/73.1 |
| 6,167,545 A * | 12/2000 | Statovici et al. | ............. | 714/724 |
| 6,434,503 B1 * | 8/2002 | Sommer | .................... | 702/123 |
| 6,725,449 B1 * | 4/2004 | Maeda et al. | ................ | 717/124 |
| 7,047,463 B1 * | 5/2006 | Organ et al. | ................ | 714/724 |

\* cited by examiner

*Primary Examiner*—David Ton
(74) *Attorney, Agent, or Firm*—Osha Liang LLP

(57) ABSTRACT

A test program debugging apparatus of the present invention includes a device under test simulator and a semiconductor testing apparatus simulator. Further, the semiconductor testing apparatus simulator includes: a verification range acquiring unit that acquires a verification range that is a range of commands to be verified among commands included in the test program; a command simplifying unit that simplifies non-setting commands other than setting commands for setting the device under test simulator, among non-verification range commands included in a non-verification range that is a range other than the verification range within the test program; and a command executing unit that executes the verification range commands included in the verification range, the setting commands, and the non-setting commands simplified by the command simplifying unit.

9 Claims, 3 Drawing Sheets

TEST PROGRAM DEBUGGER DEVICE, SEMICONDUCTOR TEST APPARATUS, TEST PROGRAM DEBUGGING METHOD AND TEST METHOD

CROSS REFERENCE TO THE RELATED APPLICATION

The present application is a continuation application of PCT/JP2004/014659 filed on Oct. 5, 2004, which claims priority from a Japanese Patent Application No. 2003-348617 filed on Oct. 7, 2003, the entire contents of which are incorporated herein by reference for all purposes.

BACKGROUND OF THE INVENTION

1. Field of the Invention

The present invention relates to a test program debugging apparatus, a semiconductor testing apparatus, a test program debugging method, and a testing method. More particularly, the present invention relates to a test program debugging apparatus and a test program debugging method for virtually executing a test program for a semiconductor testing apparatus to debug the test program, and a semiconductor testing apparatus and a testing method for executing the test program to test a device under test.

2. Description of Related Art

A semiconductor testing apparatus executes a test program for a semiconductor testing apparatus to supply a test pattern to a device under test and variously test the device under test. This test program is made up of a large number of commands prescribing a testing condition, the generation of a test pattern, the comparison of a test pattern, etc., and is made or changed in conjunction with a type of the semiconductor testing apparatus and a type of the device under test. Further, when the test program has been made or changed, it must be verified whether the test program operates normally. Thus, the verification of the test program has conventionally been performed by causing a test program debugging apparatus simulating the semiconductor testing apparatus and the device under test to execute the test program by means of a general-purpose computer such as a workstation. For example, this verification is known as disclosed in Japanese Patent Laid-Open No. 2001-51025.

However, since the test program is made up of a large number of commands as described above, it requires an enormous amount of time to execute the test program. Moreover, the conventional test program debugging apparatus cannot execute only a part of commands included in the test program. Thus, although it is desired to verify only commands corresponding to a part of a plurality of test items and only commands to generate a part of a plurality of test patterns, all commands included in the test program must be executed. Therefore, there has been a problem that it requires an enormous amount of time to verify the test program.

SUMMARY OF THE INVENTION

Therefore, it is an object of the present invention to provide a test apparatus that can solve the foregoing problems. The above and other objects can be achieved by combinations described in the independent claims. The dependent claims define further advantageous and exemplary combinations of the present invention.

According to the first aspect of the present invention, there is provided a test program debugging apparatus that debugs a test program for a semiconductor testing apparatus. The test program debugging apparatus includes: a device under test simulator operable to simulate a device under test; and a semiconductor testing apparatus simulator operable to execute the test program to simulate the semiconductor testing apparatus and supply test patterns to the device under test simulator.

The semiconductor testing apparatus simulator includes: a verification range acquiring unit that acquires a verification range that is a range of commands to be verified among commands included in the test program; a command simplifying unit that simplifies non-setting commands other than setting commands for setting the device under test simulator, among non-verification range commands included in a non-verification range that is a range other than the verification range within the test program; and a command executing unit that executes the verification range commands included in the verification range, the setting commands, and the non-setting commands simplified by the command simplifying unit.

The non-setting commands may include pattern generating commands for generating the test patterns and pattern comparing commands for comparing output patterns output from the device under test simulator in response to the test patterns with an expected value, the command simplifying unit may simplify the pattern generating commands and the pattern comparing commands, and the command executing unit may execute the verification range commands and the setting commands, and the simplified pattern generating commands and pattern comparing commands.

The command simplifying unit may set the non-setting commands as commands not executed by the command executing unit, and the command executing unit may execute the verification range commands and the setting commands and may not execute the non-setting commands.

According to the second aspect of the present invention, there is provided a test program debugging apparatus that debugs a test program for a semiconductor testing apparatus. The test program debugging apparatus includes: a device under test simulator operable to simulate a device under test; and a semiconductor testing apparatus simulator operable to execute the test program to simulate the semiconductor testing apparatus and transfer test patterns to the device under test simulator.

The semiconductor testing apparatus simulator acquires a verification range that is a range of commands to be verified among commands included in the test program, and the device under test simulator simplifies and executes a simulation based on non-setting commands other than setting commands for setting the device under test simulator, among non-verification range commands included in a non-verification range that is a range other than the verification range within the test program.

The device under test simulator may previously hold output patterns corresponding to the test patterns supplied from the semiconductor testing apparatus simulator and output the previously held output patterns in response to the test patterns from the semiconductor testing apparatus simulator based on the non-setting commands.

According to the third aspect of the present invention, there is provided a semiconductor testing apparatus that tests a device under test by executing a test program. The semiconductor testing apparatus includes: a test range acquiring unit operable to acquire a test range that is a range of commands to be used for testing the device under test, among commands included in the test program; a command simplifying unit operable to simplify non-setting commands other than setting commands for setting the device under test, among non-test range commands included in a non-test range that is a range other than the test range within the test program; and a command executing unit operable to execute the test range commands included in the test range, the setting commands, and the non-setting commands simplified by the command simplifying unit.

The non-setting commands may include pattern generating commands for generating the test patterns and pattern comparing commands for comparing output patterns output from the device under test in response to the test patterns with an expected value, the command simplifying unit may simplify the pattern generating commands and the pattern comparing commands, and the command executing unit may execute the test range commands and the setting commands, and the simplified pattern generating commands and pattern comparing commands.

According to the fourth aspect of the present invention, there is provided a test program debugging method by a test program debugging apparatus comprising a device under test simulator that simulates a device under test, and a semiconductor testing apparatus simulator that executes a test program for a semiconductor testing apparatus to simulate the semiconductor testing apparatus and supplies test patterns to the device under test simulator. The method includes the steps of: acquiring a verification range that is a range of commands to be verified among commands included in the test program; simplifying non-setting commands other than setting commands for setting the device under test simulator, among non-verification range commands included in a non-verification range that is a range other than the verification range within the test program; and executing the verification range commands included in the verification range, the setting commands, and the simplified non-setting commands.

According to the fifth aspect of the present invention, there is provided a testing method of testing a device under test by executing a test program. The method includes the steps of: acquiring a test range that is a range of commands to be used for testing the device under test, among commands included in the test program; simplifying non-setting commands other than setting commands for setting the device under test, among non-test range commands included in a non-test range that is a range other than the test range within the test program; and executing the test range commands included in the test range, the setting commands, and the simplified non-setting commands.

The summary of the invention does not necessarily describe all necessary features of the present invention. The present invention may also be a sub-combination of the features described above.

According to the present invention, it is possible to provide a test program debugging apparatus and a test program debugging method capable of precisely verifying desired commands included in a test program at short times and to provide a semiconductor testing apparatus and a testing method capable of selectively testing desired test items included in the test program.

DETAILED DESCRIPTION OF THE INVENTION

The invention will now be described based on the embodiments, which do not intend to limit the scope of the present invention, but exemplify the invention. All of the features and the combinations thereof described in the embodiment are not necessarily essential to the invention.

Figure 1:
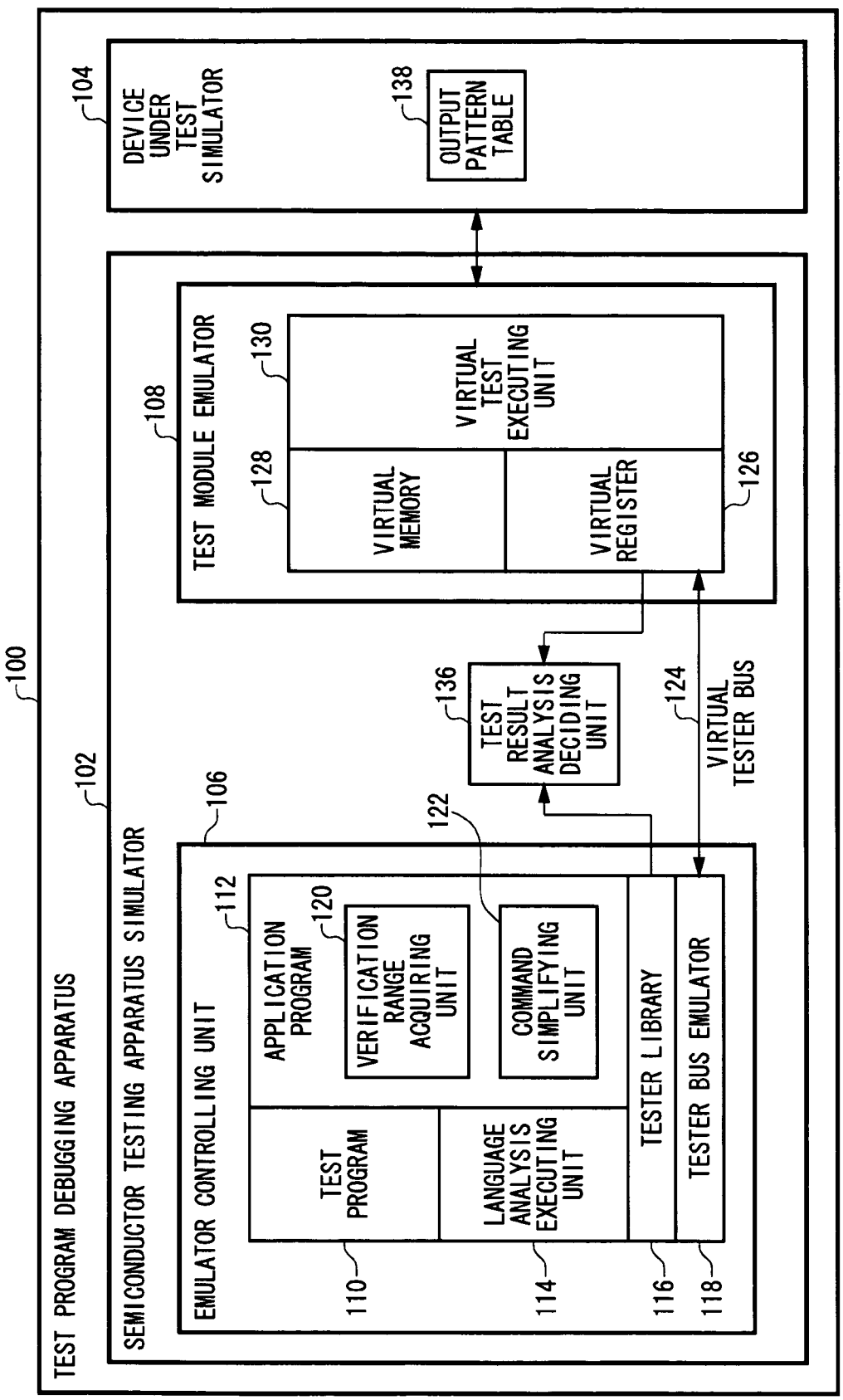
FIG. 1 is a view exemplary showing a configuration of a test program debugging apparatus.

FIG. 1 is a view exemplary showing a configuration of a test program debugging apparatus 100 according to an embodiment of the present invention. The test program debugging apparatus 100 is realized by a general-purpose computer such as workstations, and verifies whether a test program 110 operates in a normal manner to debug the test program by simulating an operation of a semiconductor testing apparatus 200 and a device under test 202. In this manner, since the test program debugging apparatus 100 simulates the semiconductor testing apparatus 200 and the device under test 202, it will firstly describe a configuration and operation of the real semiconductor testing apparatus 200 with reference to FIG. 2.

Figure 2:
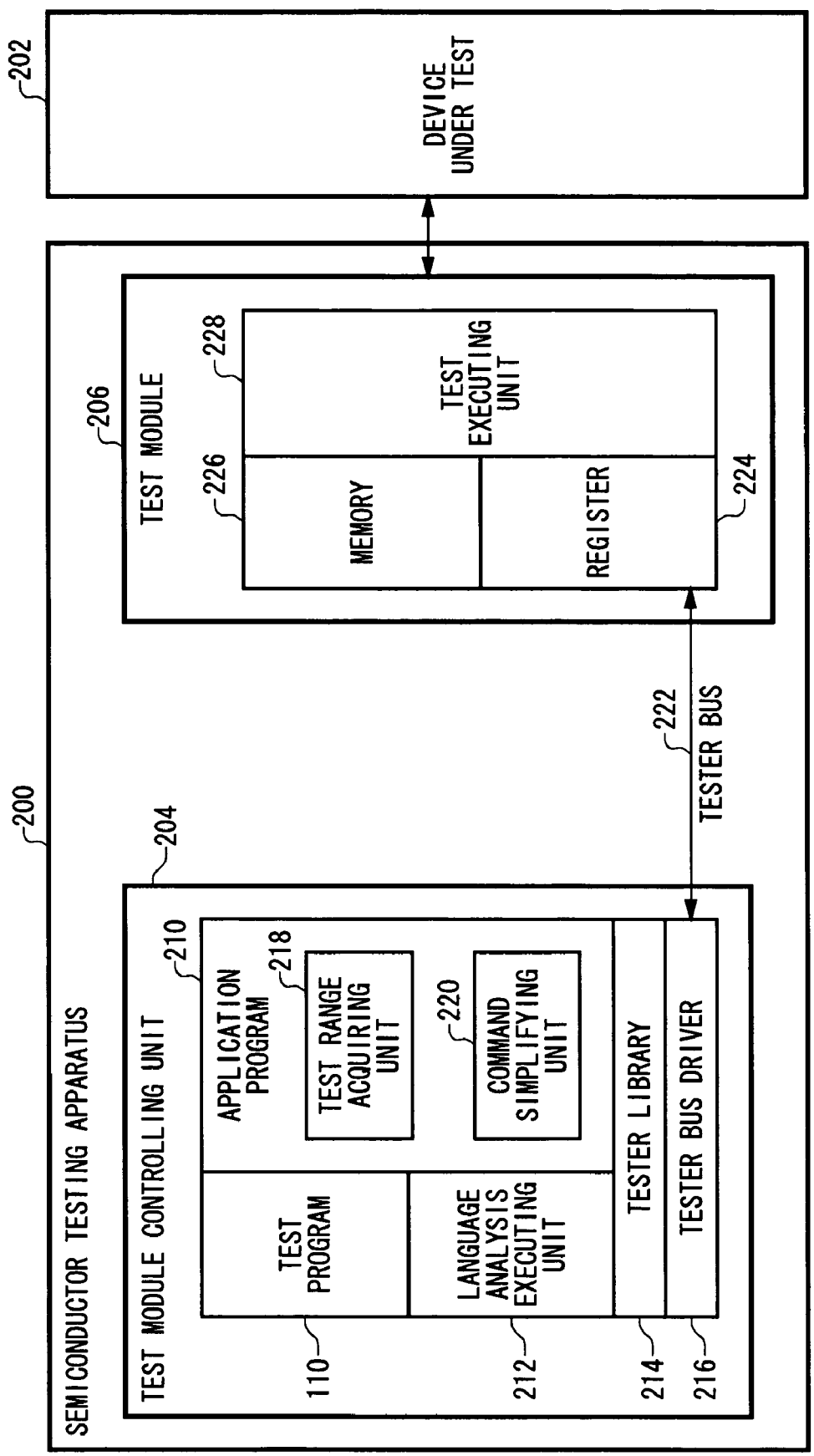
FIG. 2 is a view exemplary showing a configuration of a semiconductor testing apparatus.

FIG. 2 is a view exemplary showing a configuration of the semiconductor testing apparatus 200 according to an embodiment of the present invention. The semiconductor testing apparatus 200 includes a test module 206 connected to the device under test 202 for receiving and sending test patterns from/to the device under test 202, a test module controlling unit 204 for controlling the test module 206, and a tester bus 222 for connecting the test module controlling unit 204 and the test module 206. The test module controlling unit 204 has the test program 110, an application program 210, a language analysis executing unit 212, a tester library 214, and a tester bus driver 216. Then, the application program 210 functions as a test range acquiring unit 218 and a command simplifying unit 220. Moreover, the test module 206 has a register 224, a memory 226, and a test executing unit 228.

The test program 110 describes the contents of test conducted on the device under test 202. The language analysis executing unit 212 performs syntactic analysis of the test program 110, and operates the semiconductor testing apparatus 200 according to the test program 110. The application program 210 operates in cooperation with the test program 110 and the language analysis executing unit 212, and controls applying test patterns to the device under test 202. The tester library 214 converts commands in the test program 110 syntactically analyzed by the language analysis executing unit 212 into register level commands, in order to perform the generation of pattern data and the setting of the test module 206 and also instruct the test module 206 to perform a measurement operation. Then, the tester bus driver 216 transfers the pattern data generated by the tester library 214 to the register 224 via the tester bus 222.

The register 224 stores the pattern data generated by the tester library 214, and supplies the stored pattern data to the test executing unit 228 directly or via the memory 226. Then, the test executing unit 228 tests the device under test 202 based on the pattern data stored on the register 224 or the memory 226, and stores its test result on the register 224 or the memory 226. Then, the tester bus driver 216 acquires the test result stored on the register 224 or the memory 226 to the tester library 214 via the tester bus 222. Then, the application program 210 decides the good or bad of the device under test 202 or analyzes a characteristic of the device under test 202 based on the test result acquired to the tester library 214.

The test program debugging apparatus 100 shown in FIG. 1 simulates an operation of the semiconductor testing apparatus 200 and the device under test 202, and verifies whether the test program 110 operates normally to debug the program. Next, referring to FIG. 1, it will be described about a configuration and operation of the test program debugging apparatus 100.

The test program debugging apparatus 100 includes a device under test simulator 104 that simulates the device under test 202 and a semiconductor testing apparatus simulator 102 that executes the test program 110 to simulate the semiconductor testing apparatus 200 and supplies test patterns to the device under test 202. The semiconductor testing apparatus simulator 102 has a test module emulator 108 that emulates the test module 206, an emulator controlling unit 106 that controls the test module emulator 108, a virtual tester bus 124 that virtually connects the emulator controlling unit 106 and the test module emulator 108, a test result analysis deciding unit 136 that analyzes a test result of the device under test simulator 104.

The emulator controlling unit 106 includes the test program 110, an application program 112, a language analysis executing unit 114, a tester library 116, and a tester bus emulator 118. Then, the application program 112 functions as a verification range acquiring unit 120 and a command simplifying unit 122. Moreover, the test module emulator 108 includes a virtual register 126, a virtual memory 128, and a virtual test executing unit 130.

The emulator controlling unit 106 performs operations equal to those of the test module controlling unit 204 shown in FIG. 2, and controls the test module emulator 108 that realizes an operation of the test module 206 shown in FIG. 2 by means of software. The test program 110 is transplantation of the test program 110 shown in FIG. 2, and is an object for a debug by the test program debugging apparatus 100. The language analysis executing unit 114 performs syntactic analysis of the test program 110, and operates the semiconductor testing apparatus simulator 102 according to the test program 110. The application program 112 operates in cooperation with the test program 110 and the language analysis executing unit 114, and controls applying the test patterns to the device under test simulator 104. The tester library 116 is an example of a command executing unit of the present invention, and converts commands in the test program 110 syntactically analyzed by the language analysis executing unit 114 into register level commands, in order to perform the generation of pattern data and the setting of the test module emulator 108 and also instruct the test module emulator 108 to perform a measurement operation. Then, the tester bus emulator 118 transfers the pattern data generated by the tester library 116 to the virtual register 126 via the virtual tester bus 124.

The virtual register 126 stores the pattern data generated by the tester library 116, and supplies the stored pattern data to the virtual test executing unit 130 directly or via the virtual memory 128. Then, the virtual test executing unit 130 virtually tests the device under test simulator 104 based on the pattern data stored on the virtual register 126 or the virtual memory 128, and stores its virtual test result on the virtual register 126 or the virtual memory 128. Then, the tester bus emulator 118 acquires the virtual test result stored on the virtual register 126 or the virtual memory 128 to the tester library 116 via the virtual tester bus 124. Then, the test result analysis deciding unit 136 compares and investigates the virtual test result stored on the tester library 116, the virtual register 126, or the virtual memory 128 and an expected value of the virtual test result previously generated.

Then, the test result analysis deciding unit 136 verifies whether the test program 110 operates normally, and informs a user of the verification result. For example, when the virtual test result and the expected value are different from each other, line numbers in the test program 110 causing the virtual test result may be displayed on a monitor, or may be printed by a printer.

Figure 3:
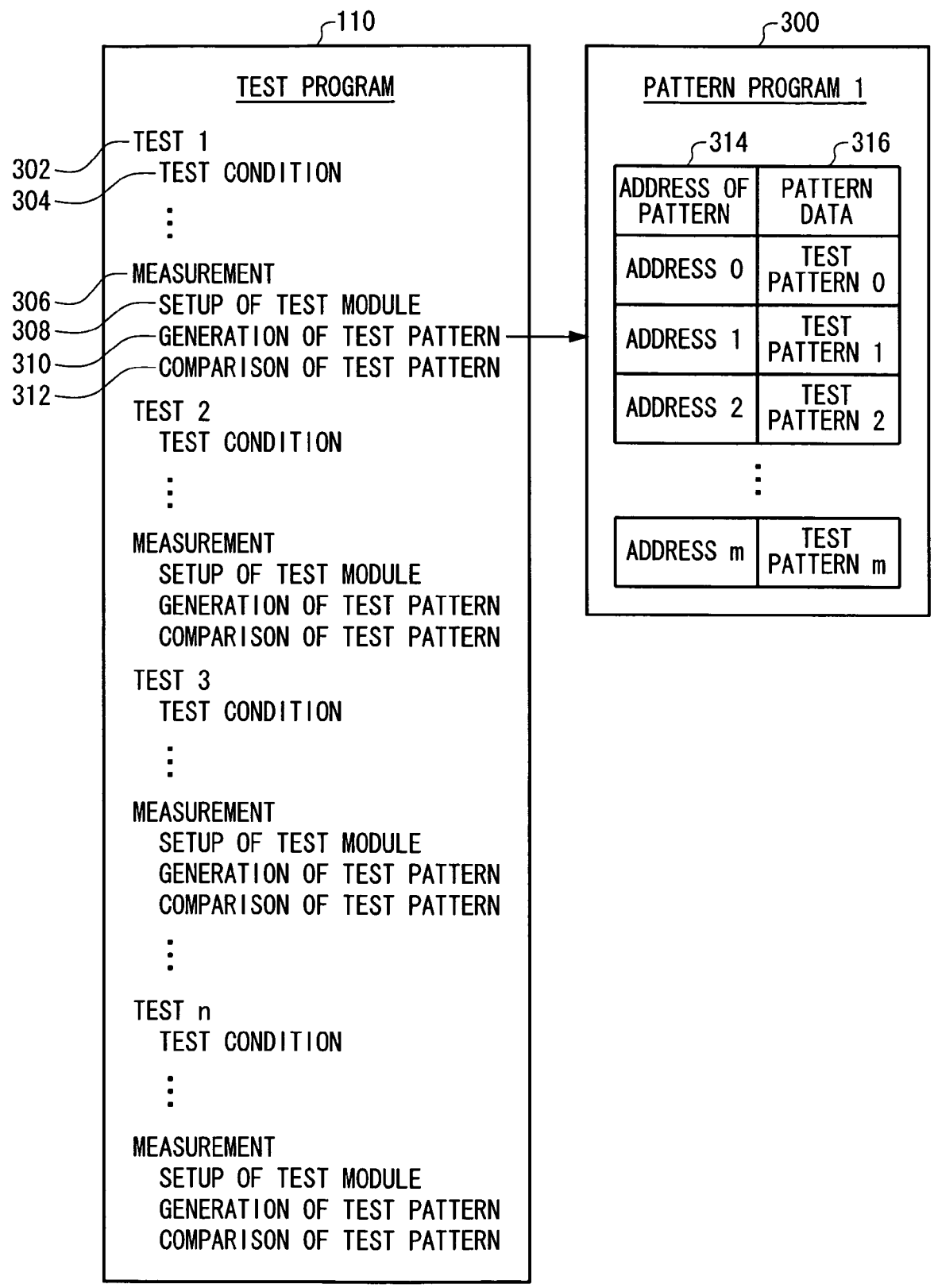
FIG. 3 is a view exemplary showing a configuration of a test program and a pattern program.

FIG. 3 is a view exemplary showing a configuration of the test program 110 and a pattern program 300. The test program 110 has a test condition command group 304 prescribing a test condition and a measurement command group 306 measuring output patterns from the device under test 202 or the test module emulator 108, every test number 302 that is an identifier of a test item. The measurement command group 306 includes setting commands 308 that are a command for setting the test module 206 or the test module emulator 108, pattern generating commands 310 that are a command for generating test patterns, and pattern comparing commands 312 for comparing output patterns output from the device under test 202 or the device under test simulator 104 in response to the test patterns with the previously generated expected value. The setting commands 308 are a command for setting, e.g., a value of the register. Moreover, the pattern program 300 is called by the pattern generating commands 310, and has information for generating the test patterns. Specifically, the pattern program 300 holds pattern data 316 indicative of the test patterns in association with addresses 314 of the test patterns.

Although the test program debugging apparatus 100 shown in FIG. 1 verifies the test program 110 by sequentially executing the test program 110 shown in FIG. 3, a user may select a range of commands to be verified among the commands included in the test program 110 or a range of pattern data to be verified among the pattern data included in the pattern program 300 and verify a part of commands included in the selected test program 110.

In other words, the verification range acquiring unit 120 acquires a verification range that is a range of commands to be verified among the commands included in the test program 110 based on an instruction input from the user. For example, when the test number 302 or the range of the test number 302 in the test program 110 is designated by the user, the verification range acquiring unit 120 acquires the test number 302 or the range of the test number 302 as a verification range. Moreover, the verification range acquiring unit 120 may acquire the range of test patterns to be verified among the test patterns included in the pattern program 300 as a verification range based on an instruction input from the user. For example, when addresses 314 of the test patterns or a range of addresses 314 of the test patterns in the pattern program 300 are designated by the user, the verification range acquiring unit 120 may acquire the test patterns of the addresses 314 of the designated test patterns or the test patterns of the range of the addresses 314 of the designated test patterns as a verification range. Moreover, when addresses 314 of the test patterns and a range of count in the pattern program 300 are designated by the user, the verification range acquiring unit 120 may acquire the test patterns in the range of count designated from the addresses 314 of the designated test patterns as a verification range. In addition, when either of the addresses 314 of the test patterns, the range of the addresses of the test patterns, and the addresses 314 of the test patterns and the range of count is not designated, the verification range acquiring unit 120 may acquire all test patterns in the pattern program 300 as a verification range.

Then, the command simplifying unit 122 simplifies non-setting commands that are commands other than setting commands 308 that are commands for setting the device under test simulator 104, among non-verification range commands that are commands included in a non-verification range that is a range other than a verification range acquired by the verification range acquiring unit 120 within the test program 110. For example, the command simplifying unit 122 simplifies pattern generating commands 310 and pattern comparing commands 312 that are the non-setting commands, and converts them into simple commands. For example, the command simplifying unit 122 detects executive commands of the test patterns provided in a previous stage of the pattern generating commands 310, and simplifies commands subsequent to the executive commands of the test patterns in test items including the executive commands of the test patterns.

Then, the tester library 116 executes the verification range commands that are commands included in the verification range acquired from the verification range acquiring unit 120, the setting commands 308 among the non-verification range commands, and the non-setting commands simplified by the command simplifying unit 122 among the non-verification range commands, and operates the test module emulator 108. Moreover, the command simplifying unit 122 may set the non-setting commands as commands not executed by the tester library 116, as another example of simplification of the non-setting commands. Then, the tester library 116 may execute the verification range commands and the setting commands, and may not execute the non-setting commands.

As described above, it is possible to verify the verification range designated by the user at short times by simplifying commands other than the verification range acquired from the user. Furthermore, by performing the setting commands such as the register value of the device under test simulator 104 without simplifying them among commands other than the verification range acquired from the user, although a part of commands in the test program 110 is used as the verification range, it is possible to accurately verify the test program 110 because the device under test simulator 104 can be operated in a similar environment to the verification of the whole test program 110.

Moreover, in another example, in place of the simplification of the non-setting commands by the command simplifying unit 122, the device under test simulator 104 may simplify and execute the simulation based on the non-setting commands. Specifically, the device under test simulator 104 has an output pattern table 138 previously holding output patterns corresponding to test patterns supplied from the semiconductor testing apparatus simulator 102. Then, the device under test simulator 104 outputs the previously held output patterns in association with the test patterns in response to the test patterns from the semiconductor testing apparatus simulator 102 based on the non-setting commands. In this way, it is possible to reduce the simulation time by the device under test simulator 104 and quickly verify the verification range.

Moreover, although the semiconductor testing apparatus 200 shown in FIG. 2 tests the device under test 202 by sequentially executing the test program 110 shown in FIG. 3, the user may selects the range of commands to be tested among the commands included in the test program 110 or the range of pattern data to be tested among the pattern data included in the pattern program 300, and test a part of the selected test program 110.

In other words, the test range acquiring unit 218 acquires the test range that is a range of commands to be tested among the commands included in the test program 110 based on an instruction input from the user. For example, when the test number 302 or the range of the test number 302 in the test program 110 is designated by the user, the test range acquiring unit 218 acquires the test number 302 or the range of the test number 302 as a test range. Moreover, the test range acquiring unit 120 may acquire the range of test patterns to be tested among the test patterns included in the pattern program 300 as a test range based on an instruction input from the user. For example, when addresses 314 of the test patterns or a range of addresses 314 of the test patterns in the pattern program 300 are designated by the user, the test range acquiring unit 218 may acquire the test patterns of the addresses 314 of the designated test patterns or the test patterns of the range of the addresses 314 of the designated test patterns as a test range. Moreover, when addresses 314 of the test patterns and a range of count in the pattern program 300 are designated by the user, the test range acquiring unit 218 may acquire the test patterns in the range of count designated from the addresses 314 of the designated test patterns as a test range. In addition, when either of the addresses 314 of the test patterns, the range of the addresses of the test patterns, and the addresses 314 of the test patterns and the range of count is not designated, the test range acquiring unit 218 may acquire all test patterns in the pattern program 300 as a test range.

Then, the command simplifying unit 220 simplifies non-setting commands that are commands other than setting commands 308 that are commands for setting the device under test 202, among non-test range commands that are commands included in a non-test range that is a range other than a test range acquired by the test range acquiring unit 218 within the test program 110. For example, the command simplifying unit 220 simplifies pattern generating commands 310 and pattern comparing commands 312 that are the non-setting commands, and converts them into simple commands. Then, the tester library 214 executes the test range commands that are commands included in the test range acquired from the test range acquiring unit 218, the setting commands 308 among the non-test range commands, and the non-setting commands simplified by the command simplifying unit 220 among the non-test range commands, and operates the test module 206. Moreover, the command simplifying unit 220 may set the non-setting commands as commands not executed by the tester library 214, as another example of simplification of the non-setting commands. Then, the tester library 214 may execute the test range commands and the setting commands, and may not execute the non-setting commands.

As described above, it is possible to verify the test range designated by the user at short times by simplifying commands other than the test range acquired from the user. Furthermore, by performing the setting commands such as the register value of the device under test 202 without simplifying them among commands other than the test range acquired from the user, although a part of commands in the test program 110 is used as the test range, it is possible to accurately test the test program 110 because the device under test 202 can be operated in a similar environment to the test of the whole test program 110.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to provide a test program debugging apparatus and a test program debugging method capable of precisely verifying desired commands included in a test program at short times and also provide a semiconductor testing apparatus and a test method capable of selectively testing desired test items included in the test program.

What is claimed is:

1. A test program debugging apparatus that debugs a test program for a semiconductor testing apparatus, comprising:
    a device under test simulator operable to simulate a device under test; and
    a semiconductor testing apparatus simulator operable to execute the test program to simulate the semiconductor testing apparatus and supply test patterns to said device under test simulator, wherein
    said semiconductor testing apparatus simulator comprises:
    a verification range acquiring unit that acquires a verification range that is a range of commands to be verified among commands included in the test program;
    a command simplifying unit that simplifies non-setting commands other than setting commands for setting said device under test simulator, among non-verification range commands included in a non-verification range that is a range other than the verification range within the test program; and
    a command executing unit that executes the verification range commands included in the verification range, the setting commands, and the non-setting commands simplified by said command simplifying unit.

2. The test program debugging apparatus as claimed in claim 1, wherein
    the non-setting commands includes pattern generating commands for generating the test patterns and pattern comparing commands for comparing output patterns output from said device under test simulator in response to the test patterns with an expected value,
    said command simplifying unit simplifies the pattern generating commands and the pattern comparing commands, and
    said command executing unit executes the verification range commands and the setting commands, and the simplified pattern generating commands and pattern comparing commands.

3. The test program debugging apparatus as claimed in claim 1, wherein
    said command simplifying unit sets the non-setting commands as commands not executed by said command executing unit, and
    said command executing unit executes the verification range commands and the setting commands and does not execute the non-setting commands.

4. A test program debugging apparatus that debugs a test program for a semiconductor testing apparatus, comprising:
    a device under test simulator operable to simulate a device under test; and
    a semiconductor testing apparatus simulator operable to execute the test program to simulate the semiconductor testing apparatus and transfer test patterns to said device under test simulator, wherein
    said semiconductor testing apparatus simulator acquires a verification range that is a range of commands to be verified among commands included in the test program, and
    said device under test simulator simplifies and executes a simulation based on non-setting commands other than setting commands for setting said device under test simulator, among non-verification range commands included in a non-verification range that is a range other than the verification range within the test program.

5. The test program debugging apparatus as claimed in claim 4, wherein said device under test simulator previously holds output patterns corresponding to the test patterns supplied from said semiconductor testing apparatus simulator and outputs the previously held output patterns in response to the test patterns from said semiconductor testing apparatus simulator based on the non-setting commands.

6. A semiconductor testing apparatus that tests a device under test by executing a test program, comprising:
    a test range acquiring unit operable to acquire a test range that is a range of commands to be used for testing the device under test, among commands included in the test program;
    a command simplifying unit operable to simplify non-setting commands other than setting commands for setting the device under test, among non-test range commands included in a non-test range that is a range other than the test range within the test program; and
    a command executing unit operable to execute the test range commands included in the test range, the setting commands, and the non-setting commands simplified by said command simplifying unit.

7. The semiconductor testing apparatus as claimed in claim 6, wherein
    the non-setting commands includes pattern generating commands for generating the test patterns and pattern comparing commands for comparing output patterns output from the device under test in response to the test patterns with an expected value,
    said command simplifying unit simplifies the pattern generating commands and the pattern comparing commands, and
    said command executing unit executes the test range commands and the setting commands, and the simplified pattern generating commands and pattern comparing commands.

8. A test program debugging method by a test program debugging apparatus comprising a device under test simulator that simulates a device under test, and a semiconductor testing apparatus simulator that executes a test program for a semiconductor testing apparatus to simulate the semiconductor testing apparatus and supplies test patterns to the device under test simulator, the method comprising the steps of:
    acquiring a verification range that is a range of commands to be verified among commands included in the test program;
    simplifying non-setting commands other than setting commands for setting the device under test simulator, among non-verification range commands included in a non-verification range that is a range other than the verification range within the test program; and
    executing the verification range commands included in the verification range, the setting commands, and the simplified non-setting commands.

9. A testing method of testing a device under test by executing a test program, the method comprising the steps of:

acquiring a test range that is a range of commands to be used for testing the device under test, among commands included in the test program;

simplifying non-setting commands other than setting commands for setting the device under test, among non-test range commands included in a non-test range that is a range other than the test range within the test program; and executing the test range commands included in the test range, the setting commands, and the simplified non-setting commands.

* * * * *